United States Patent
Sheehan et al.

(10) Patent No.: US 6,759,483 B2
(45) Date of Patent: Jul. 6, 2004

(54) PREPARATION OF HOMO-, CO- AND TERPOLYMERS OF SUBSTITUTED STYRENES

(75) Inventors: Michael T. Sheehan, Corpus Christi, TX (US); James R. Sounik, Corpus Christi, TX (US)

(73) Assignee: Chemfirst Electronic Materials L.P., Dallas, TX (US)

( * ) Notice: Subject to any disclaimer, the term of this patent is extended or adjusted under 35 U.S.C. 154(b) by 70 days.

(21) Appl. No.: 10/126,719

(22) Filed: Apr. 19, 2002

(65) Prior Publication Data

US 2002/0156199 A1 Oct. 24, 2002

Related U.S. Application Data

(63) Continuation-in-part of application No. 09/520,532, filed on Mar. 8, 2000, now abandoned, which is a continuation-in-part of application No. 09/072,936, filed on May 5, 1998, now abandoned.

(51) Int. Cl.$^7$ ............................................. C08F 216/02
(52) U.S. Cl. ................. 525/328.8; 525/333.3; 525/344; 525/346; 526/319; 526/219.6; 526/323.2; 526/329.7; 526/346; 526/347.1
(58) Field of Search .......................... 525/328.8, 333.3, 525/344, 346, 333.5, 333.6, 374; 526/319, 219.6, 323.2, 329.7, 346, 347.1

(56) References Cited

U.S. PATENT DOCUMENTS

| | | | |
|---|---|---|---|
| 4,491,628 A | 1/1985 | Ito et al. ...................... 430/176 |
| 4,636,540 A | 1/1987 | Warfel ......................... 523/310 |
| 4,678,843 A | 7/1987 | Elmore et al. ............... 525/378 |
| 4,689,371 A | 8/1987 | Elmore et al. ............... 525/374 |
| 4,822,862 A | 4/1989 | Rupp et al. .................. 525/367 |
| 4,877,843 A | 10/1989 | Gupta ......................... 525/344 |
| 4,880,487 A | * 11/1989 | Sheehan et al. ............. 156/327 |
| 4,898,916 A | 2/1990 | Gupta ......................... 525/344 |
| 4,912,173 A | 3/1990 | Keene et al. ................ 525/378 |
| 4,931,379 A | 6/1990 | Brunsvold et al. ........... 430/270 |
| 4,939,070 A | 7/1990 | Brunsvold et al. ........... 430/312 |
| 4,962,147 A | 10/1990 | Vicari ......................... 524/460 |
| 5,087,772 A | 2/1992 | Sheehan et al. ............. 568/804 |
| 5,239,015 A | * 8/1993 | Sheehan et al. ............. 525/344 |
| 5,264,528 A | * 11/1993 | Sheehan et al. ............. 525/384 |
| 5,304,610 A | 4/1994 | Bhattacharya et al. ... 525/327.1 |
| 5,625,007 A | * 4/1997 | Sheehan et al. ......... 525/328.8 |
| 5,625,020 A | 4/1997 | Breyta et al. ............. 526/329.2 |
| 5,789,522 A | 8/1998 | Zampini et al. ............. 528/129 |
| 5,919,597 A | 7/1999 | Sinta et al. .................. 430/270 |
| 5,939,511 A | 8/1999 | Zampini et al. ............. 528/143 |

FOREIGN PATENT DOCUMENTS

| | | |
|---|---|---|
| EP | 260 104 A | 3/1988 |
| EP | 277 721 A | 10/1988 |
| EP | 544 324 B | 6/1993 |
| EP | 605 089 B | 7/1994 |
| EP | 813 113 A | 12/1997 |
| WO | WO 94/14858 A | 7/1994 |

\* cited by examiner

*Primary Examiner*—Tatyana Zalukaeva
(74) *Attorney, Agent, or Firm*—James J. Mullen

(57) ABSTRACT

A novel one-pot cost efficient process for the preparation of homo-, co- and terpolymers of p-hydroxystyrene or substituted p-hydroxystyrene and alkyl acrylates. The process involves polymerization of esters of p-hydroxystyrene (or its substituted analogs), alkyl acrylate monomers and/or one or more of ethylenically unsaturated monomers in an alcohol solvent in the presence of a free radical initiator. The reaction mixture containing the so formed polymer is subjected to transesterification conditions using a catalytic amount of catalyst to result in co- and/or terpolymers of p-hydroxystyrene without cleavage of the alkyl ester in the acrylate repeat unit, and then removing the catalyst from the system. Preferred embodiments include homopolymers of p-hydroxystyrene, copolymer of p-hydroxystyrene and tert-butyl acrylate and terpolymer of p-hydroxystyrene, tert-butyl acrylate and styrene. These polymers have a wide variety of applications including as photoresists in microelectronics industry.

29 Claims, No Drawings

PREPARATION OF HOMO-, CO- AND TERPOLYMERS OF SUBSTITUTED STYRENES

IDENTIFICATION OF PRIOR APPLICATION

This application is a continuation-in-part of application Ser. No. 09/520,532 filed Mar. 8, 2000 now abandoned, which in turn is a continuation-in-part of Ser. No. 09/072,936, filed May 5, 1998, now abandoned.

BACKGROUND OF THE INVENTION

1. Field of the Invention

This invention relates to the production of homo-, co- and ter-polymers of substituted styrenes such as p-acetoxystyrene (ASM), and/or alkyl acrylates and/or other monomers that are useful in photoresists and optical applications.

2. Description of the Prior Art

There is a desire in the industry for higher circuit density in microelectronic devices that are made using lithographic techniques. One method of increasing the number of components per chip is to decrease the minimum feature size on the chip, which requires higher lithographic resolutions. The use of shorter wavelength radiation (e.g., deep UV e.g. 190 to 315 am) than the currently employed mid-UV spectral range (e.g. 350 am to 450 am) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in U.S. Pat. No. 4,491,628 (Jan. 1, 1985) and Nalamasu et al, "An Overview of Resist Processing for Deep UV Lithography", J. Photopolymer Sci. Technol. 4, 299 (1991). The resist compositions generally comprise a photosensitive acid generator and an acid sensitive polymer. The polymer has acid sensitive side chain (pendant) groups that are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in non-polar organic solvents such as anisole. Thus the resist can produce positive or negative images of the mask depending of the selection of the developer solvent. Although chemically amplified resist compositions generally have suitable lithographic sensitivity, in certain applications, their performance can be improved by (i) increasing their thermal stability in terms of thermal decomposition and plastic flow and (ii) increasing their stability in the presence of airborne chemical contaminants. For example, in some semiconductor manufacturing processes, post image development temperatures (e.g. etching, implantation etc.) can reach 200° C. Brunsvold et al., U.S. Pat. Nos. 4,939,070 (issued Jul. 3, 1990) and U.S. Pat. No. 4,931,379 (issued Jun. 5, 1990) disclose chemically amplified, acid sensitive resist compositions having increased thermal stability in the post image development stage. Brunsvold's resist compositions form a hydrogen bonding network after cleavage of the acid sensitive side chain group to increase the thermal stability of the polymer. Brunsvold avoids hydrogen-bonding moieties prior to the cleavage reaction because such hydrogen bonding is known to unacceptably destabilize the acid sensitive side chain. Although Brunsvold resists have suitable thermal stability, they also have lower sensitivity and therefore are unsuitable in certain applications.

With respect to chemical contamination, MacDonald et al. SPIE 14662. (1991) reported that due to the catalytic nature of the imaging mechanisms, chemically amplified resist systems are sensitive toward minute amounts of airborne chemical contaminants such as basic organic substances. These substances degrade the resulting developed image in the film and cause a loss of the linewidth control of the developed image. This problem is exaggerated in a manufacturing process where there is an extended and variable period of time between applying the film to the substrate and development of the image. In order to protect the resist from such airborne contaminants, the air surrounding the coated film is carefully filtered to remove such substances. Alternatively, the resist film is overcoated with a protective polymer layer. However, these are cumbersome processes.

Therefore, there was a need in the art for an acid sensitive, chemically amplified photoresist composition having high thermal stability and stability in the presence of airborne chemical contaminants for use in semiconductor manufacturing. Apparently, this was accomplished in the invention outlined in U.S. Pat. No. 5,625,020 which relates to a photosensitive resist composition comprising (i) a photosensitive acid generator and (ii) a polymer comprising hydroxystyrene and acrylate, methacrylate or a mixture of acrylate and methacrylate. The resist has high lithographic sensitivity and high thermal stability. The resist also exhibits surprising stability in the presence of airborne chemical contaminants. However, one of the problems with this composition was that the process of preparing the polymer as outlined in column 3, lines 10-30 and in Example 1 (of U.S. Pat. No. 5,625,020) results in poor conversion rates and chemical cleavage of some groups in the repeat units. Thus, one of the objects of the present invention is an improved process for preparing the polymers used in the photoresist compositions.

The processes of the present invention provide methods which are fast, clean, anhydrous, and render the analysis of catalyst used therein in an easy manner. Furthermore, the polymer in solution, if desired can be further treated to provide a photoresist composition which can be directly used without isolating the polymer beforehand.

Prior Art

The following references are disclosed as general background information.

1. U.S. Pat. No. 4,898,916 discloses a process for the preparation of poly(vinylphenol) from poly (acetoxystyrene by acid catalyzed transesterification.
2. U.S. Pat. No. 5,239,015 discloses a process for preparing low optical density polymers and co-polymers for photoresists and optical applications.
3. U.S. Pat. No. 5,625,007 discloses a process for making low optical polymers and co-polymers for photoresists and optical applications.
4. U.S. Pat. No. 5,625,020 discloses a process for making a photoresist composition containing a photosensitive acid generator and a polymer comprising the reaction product of hydroxystyrene with acrylate, methacrylate or a mixture of acrylate and methacrylate.

5. EP 0 813113 A1, Barclay, discloses an aqueous transesterification to deprotect the protected polymer.
6. WO 94 14858 A discloses polymerizing hydroxystyrene without the protecting group.

Other patents of interest are U.S. Pat. Nos. 4,679,843; 4,822,862; 4,912,173; 4,962,147, 5,087,772; and 5,304,610.

All of the references described herein are incorporated herein by reference in their entirety.

SUMMARY OF THE INVENTION

This invention relates to a novel, one-pot, cost efficient process for the preparation of homopolymers and copolymers such as terpolymers and tetrapolymers of p-hydroxystyrene or substituted p-hydroxystyrene and/or alkyl acrylates and/or other monomers. The process involves polymerization of esters of p-hydroxystyrene (or its substituted analogs), alkyl acrylate monomers and/or one or more of ethylenically unsaturated monomers in an alcohol solvent in the presence of a free radical initiator. The anhydrous reaction mixture containing the so formed polymer is then subjected to transesterification conditions using a catalytic amounts of catalyst to result in co- and/or terpolymers of p-hydroxystyrene without cleavage of the alkyl ester in the acrylate repeat unit. Preferred embodiments include homopolymers of p-hydroxystyrene; copolymers of p-hydroxystyrene, and tert-butyl acrylate; and terpolymer of p-hydroxystyrene, tert-butyl acrylate and styrene. These polymers have a wide variety of applications including as photoresists in microelectronics industry.

DETAILED DESCRIPTION OF THE INVENTION

The present invention thus provides, in part, a novel process for producing polymers that are used in photoresist compositions. The process is an improvement over the prior art and is quite efficient. Specifically, this invention provides a process for the preparation of a polymer of I,

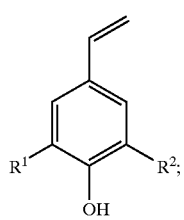

an acrylate monomer having the formula II,

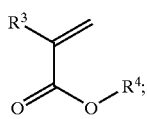

and/or one or more ethylenically unsaturated copolymerizable monomers (EUCM) selected from the group consisting of styrene, 4-methylstyrene, styrene alkoxide wherein the alkyl portion is $C_1$-$C_5$ straight or branch chain maleic anhydride, dialkyl maleate, dialkyl fumarate and vinyl chloride, wherein alkyl is having 1 to 4 carbon atoms, comprising the steps of:

a) subjecting a monomer of formula III,

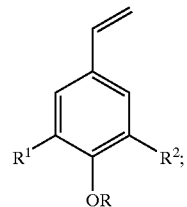

wherein R is either —OC(O)$R^5$ or —O$R^5$;

said monomer II, and/or one or more of said copolymerizable monomers to suitable polymerization conditions in a carboxylic alcohol solvent and in the presence of a free radical initiator at suitable temperature for a sufficient period of time to produce a polymer of corresponding composition;

b) subjecting said polymer from step a) to transesterification conditions in said alcohol solvent in the presence of a catalyst at suitable temperature such that the transesterified by-product ester formed is continuously removed from the reaction mixture to form the polymer of I, II, and said copolymerizable monomer;

c) contacting said polymer solution in said carboxylic alcohol solvent from step b) with a cation-exchange resin to remove said catalyst; and (optionally)

d) isolating said polymer from step c) either by precipitation from said alcohol solvent or by removal of said alcohol solvent by evaporation;

wherein:

i) $R^1$ and $R^2$ are the same or different and are independently selected from the group consisting of:
hydrogen;
fluorine, chlorine or bromine;
alkyl or fluoroalkyl group having the formula $C_nH_xF_y$ where n is an integer from 1 to 4, x and y are integers from 0 to 2n+1, and the sum of x and y is 2n+1; and
phenyl or tolyl;

ii) $R^3$ is selected from the group consisting of:
hydrogen; and
methyl, ethyl, n-propyl, iso-propyl, n-butyl, iso-butyl or tert.-butyl;

iii) $R^4$ is selected from the group consisting of methyl, ethyl, n-propyl, iso-propyl, n-butyl, iso-butyl, tert.-butyl, tert.-amyl, benzyl, cyclohexyl, 9-anthracenyl, 2-hydroxyethyl, cinnamyl, adamantyl, methyl or ethyl adamantly, isobornyl, 2-ethoxyethyl, n-heptyl, n-hexyl, 2-hydroxypropyl, 2-ethylbutyl, 2-methoxypropyl, 2-(2-methoxyethoxyl), 2-phenylethyl, phenyl, and the like.

iv) $R^5$ is $C_1$-$C_5$ alkyl, either straight or branch chain.

It is also within the scope of the present invention to prepare a homopolymer of formula I from the monomer of formula III. As one preferred embodiment, polyhydroxystyrene (PHS) can be prepared from acetoxystyrene monomer (ASM) according to the novel processes set forth herein.

The scope of the present invention thus covers, without limitation, (a) a homopolymer of formula I derived from formula III monomer; (b) a copolymer derived from formula II and formula III monomers; (c) a copolymer derived from formula III monomers and the EUCM; and (d) a terpolymer derived from monomers of formula II, formula III and EUCM.

In conjunction with formula II (an acrylate monomer) set forth herein, some preferred acrylate monomers are (1) MAA—methyl adamantyl acrylate, (2) MAMA—methyl adamantyl methacrylate, (3) EAA—ethyl adamantylyacrylate, (4) EAMA—ethyl adamantyl methacrylate, (5) ETCDA—ethyl tricyclodecanyl acrylate, (6) ETCDMA—ethyl tricyclodecanyl methacrylate, (7) PAMA—propyl adamantyl methacrylate, (8) MBAMA—methoxybutyl adamantyl methacrylate, (9) MBAA—methoxybutyl adamantyl acrylate, (10) isobornylacrylate, (11) isobornylmethacrylate, (12) cyclohexylacrylate, and (12) cyclohexylmethacrylate.

Copolymers, including ter- and tetra-polymers, having polyhydroxystyrene (PHS) and one of the above acrylate monomers are some of the materials that are made by the novel processes of the present invention.

In a preferred embodiment the reaction mixture may also comprise a second solvent. The second solvent is selected from the group consisting of tetrahydrofuran, methyl ethyl ketone, acetone, and 1,4-dioxane.

The carboxylic alcohol solvent is an alcohol having 1 to 4 carbon atoms and is selected from the group consisting of methanol, ethanol, isopropanol, tert.-butanol, and combinations thereof. The amount of solvent and/or second solvent used is not critical and can be any amount which accomplishes the desired end result.

The free radical initiator may be any initiator that achieves the desired end result. The initiator may be selected from the group consisting of 2,2'-azobis(2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, diisononanoyl peroxide, decanoyl peroxide, succinic acid peroxide, di(n-propyl) peroxydicarbonate, di(sec-butyl) peroxydicarbonate, di(2-ethylhexyl) peroxydicarbonate, t-butylperoxyneodecanoate, 2,5-dimethyl-2,5-di(2-ethylhexanoylperoxy)hexane, t-amylperoxyneodecanoate, dimethyl 2,2'-azobisisobutyrate and combinations thereof.

As a preferred embodiment, the initiator is selected from the group consisting of 2,2'-azobis(2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, and combinations thereof.

The amount of initiator is any amount that accomplishes the desired end result. However, as a preferred embodiment, said initiator is present to about three mole percent based upon the total moles of all of said monomers I, II, and said copolymerizable monomers.

The polymerization conditions are any temperature and pressure that will produce the desired end result. In general, the temperatures are from about 30° C. to about 100° C., preferably from about 40° C. to about 100° C., and most preferably from about 45° C. to about 90° C. The pressure may be atmospheric, sub-atmospheric or super-atmospheric. The polymerization time is not critical, but generally will take place over a period of at least one minute in order to produce a polymer of corresponding composition.

In step (b), in a transesterification, the polymer step (a) is subjected to said transesterification conditions in said alcohol solvent in the presence of a catalytic amount of a transesterification catalyst. The catalyst is such that it will not substantially react with said alkyl acrylate monomer II, or with said co-polymerizable monomers. The catalyst is selected from the group consisting of ammonia, lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, and combinations thereof, wherein the carboxylic alkoxide anion is similar to the carboxylic alcohol solvent. It is also understood that the catalyst can be alkali metal hydroxides such as lithium hydroxide, sodium hydroxide, potassium hydroxide, cesium hydroxide and combinations thereof. If the monomer being used is —OR, where it is —OR$^5$ (Formula III, then the catalyst is a strong acid such as a mineral acid like hydrochloric acid (HCL).

The amount of catalyst employed is from about 0.1 mole percent to about 2 mole percent of monomer I present in the composition of said polymer.

In a preferred embodiment, the catalyst is added in step (b) as a solution in said alcohol solvent.

The temperature in step (b) is such that the transesterified by-product ester formed can be continually removed from the reaction mixture to form the polymer of I, II, and said copolymerizable monomer. Such temperatures can be from about 50° C. to about 200° C. In a preferred embodiment, the transesterification reaction is carried out at reflux temperature of said alcohol solvent.

In step (c), the cation-exchange resin is preferably a strongly acidic cation exchange resin. An acidic ion exchange resin, such as sulfonated styrene/divinylbenzene cation exchange resin in hydrogen form is preferably utilized in the present process. Suitable acidic exchange resins are available from Rohm and Haas Company, e.g. AMBERLYST 15 acidic ion exchange resin. These Amberlyst resins typically contain as much as 80,000 to 200,000 ppb of sodium and iron. Before being utilized in the process of the invention, the ion exchange resin must be treated with water and then a mineral acid solution to reduce the metal ion level. When purifying the polymer solution, it is important that the ion exchange resin is then rinsed with a solvent that is the same as, or at least compatible with, the polymer solution solvent. The procedure in step (c) may be similar to those procedures disclosed in U.S. Pat. Nos. 5,284,930 and 5,288,850.

In conjunction with steps (a), (b) and (c) above, it is critical that all three steps be conducted on an anhydrous basis, i.e. where the water level is less than about 5000 parts per million (ppm), in order to avoid possible side reactions, and provide a mechanism to provide a convenient and direct route to a resist composition without having to isolate the product and then carry out additional processing steps.

In optional step (d), an isolation may be accomplished by precipitation of said polymer from the reaction medium by adding said reaction medium to a third or non-alcohol solvent for the product as for example one selected from the group consisting of water, hexane, heptane, octane, petroleum ether, and combinations thereof. It is also within the scope of the present invention to conduct an optional step (e) in place of step (d), wherein after step (c) the polymer in the alcoholic solvent is replaced with a photoresist compatible solvent such as those listed in the prior art set forth herein. An example of such a solvent is propylene glycol monomethyl ether acetate(PGMEA); other solvents are well known in the art. In this manner, the resulting polymer in the PGMEA can be directly treated with other chemicals in order to directly form a photoresist composition without having to isolate the polymer from step (c) and then drying it and then redissolving it for further processing.

As an example of the preparation of the terpolymer described above, there is provided a process for the preparation of a polymer of IV,

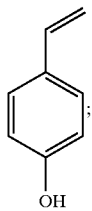

an alkyl acrylate monomer having the formula II,

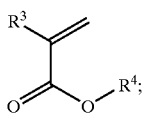

and an ethylenically unsaturated copolymerizable monomer selected from the group consisting of styrene, 4-methylstyrene, maleic anhydride, dialkyl maleate, dialkyl fumarate and vinyl chloride, wherein alkyl is having 1 to 4 carbon atoms, comprising the steps of:
  a) subjecting a monomer of formula V,

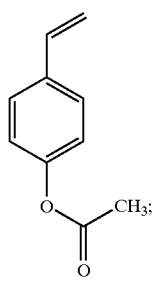

along with said monomer II, and said copolymerizable monomer to suitable polymerization conditions in a carboxylic alcohol solvent and in the presence of a free radical initiator at suitable temperature for a sufficient period of time to produce a polymer of corresponding composition;
  b) subjecting said polymer from step a) to transesterification conditions in said alcohol solvent in the presence of catalytic amounts of a catalyst at the reflux temperature of said alcohol solvent such that the transesterified by-product acetate formed is continuously removed from the reaction mixture to form the polymer of IV, II, and said copolymerizable monomer;
  c) contacting said polymer solution in said alcohol solvent from step b) with an cation-exchange resin in hydrogen form to remove said catalyst; and
  d) isolating said polymer from step c) by precipitation from said alcohol solvent;
  wherein:
    i) $R^3$ is either hydrogen or methyl; and
    ii) $R^4$ is either isopropyl or tert.-butyl.

In this example, $R^3$ is hydrogen or methyl and $R^4$ is tert-butyl or iso-propyl. The initiator is selected from the group consisting of 2,2'-azobis(2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, and combinations thereof. The alcohol solvent is an alcohol having 1 to 4 carbon atoms selected from the group consisting of methanol, ethanol, isopropanol, tert.-butanol, and combinations thereof. A preferred embodiment is where the alcohol solvent is methanol. The catalyst will not substantially react with said alkyl acrylate monomer II or with said copolymerizable monomers and is either alkali metal hydroxide or alkali metal alkoxide, and further is selected from the group consisting of lithium hydroxide, lithium methoxide, lithium ethoxide, lithium isopropoxide, sodium hydroxide, sodium methoxide, sodium ethoxide, sodium isopropoxide, potassium hydroxide, potassium methoxide, potassium ethoxide, potassium isopropoxide, cesium hydroxide, cesium methoxide, cesium ethoxide, cesium isopropoxide, and combinations thereof. As a preferred embodiment, the catalyst is sodium methoxide and is present in an amount of about 0.1 mole percent to about 2 mole percent based upon the atomic weight of sodium and moles of monomer IV present in said polymer. Furthermore, the said catalyst is added in step b) by dissolving it in said alcohol solvent, and the precipitation of said polymer is accomplished by adding said reaction medium to a third or non-alcohol solvent for the product which is selected from the group consisting of water, hexane, heptane, octane, petroleum ether, and combinations thereof. The preferred third or non-alcohol solvent is water. Thus in this example of the novel process, said polymer is a terpolymer of monomer IV, monomer II, and styrene.

In another facet of the present invention there is provided a process for the preparation of a polymer of IV,

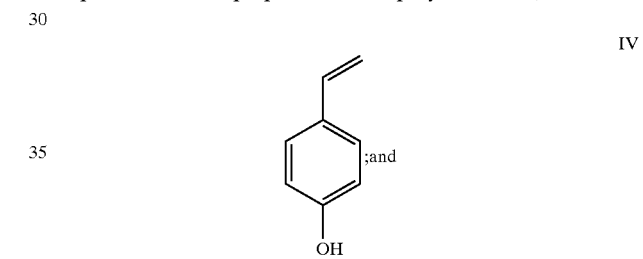

an alkyl acrylate monomer having the formula II,

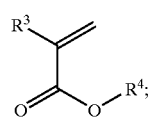

comprising the steps of:
  a) subjecting monomer of formula V,

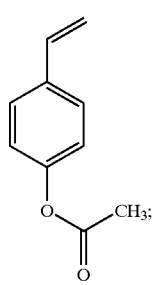

and said monomer II to suitable polymerization conditions in an alcohol solvent and in the presence of a free radical initiator at suitable temperature for a sufficient period of time to produce a polymer of corresponding composition;

b) subjecting said polymer from step a) to transesterification conditions in said alcohol solvent in the presence of catalytic amounts of catalyst at reflux temperature of said alcohol solvent such that the transesterified by-product acetate formed is continuously removed from the reaction mixture to form the polymer of IV and II;

c) passing said polymer solution in said alcohol solvent from step b) through an ion-exchange bed to remove said catalyst; and d) isolating said polymer from step c) by precipitation from said alcohol solvent;

wherein:

i) $R^3$ is either hydrogen or methyl; and ii) $R^4$ is either isopropyl or tert.-butyl.

In this process for the preparation of a copolymer, the initiator is selected from the group consisting of 2,2'-azobis (2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, and combinations thereof. The alcohol solvent is an alcohol having 1 to 4 carbon atoms selected from the group consisting of methanol, ethanol, isopropanol, tert.-butanol, and combinations thereof. The catalyst will not substantially react with said alkyl acrylate monomer II. The catalyst is a member of the group of ammonia, and alkali metal alkoxides selected from the group consisting of lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, and combinations thereof. The catalyst, e.g., can be sodium methoxide and is present in an amount of about 0.1 mole percent to about 2 mole percent based upon the moles of monomer IV present in said polymer.

This invention is further illustrated by the following examples that are provided for illustration purposes and in no way limits the scope of the present invention.

EXAMPLES (GENERAL)

In the Examples that follow, the following abbreviations are used:

ASM—p-Acetoxystyrene monomer t-BPP—tert.-butyl peroxypivalate

THF—Tetrahydrofuran

GPC—Gel permeation chromatography

GC—Gas chromatography

FTIR—Fourier transform infrared spectroscopy

NMR—Nuclear magnetic resonance spectroscopy, usually of either proton, $^1H$; and/or carbon 13, $^{13}C$ nuclei.

DSC—Differential scanning calorimetry

UV-Vis—Ultraviolet-Visible Spectroscopy

General Analytical Techniques Used for the Characterization: A variety of analytical techniques were used to characterize the co- and terpolymers of the present invention that included the following:

NMR: $^1H$ and $^{13}C$ NMR spectra were recorded on a Bruker 400 MHz spectrometer with 5 mm probes at 400 and 100 MHz, respectively.

GPC: GPC was performed on a Waters gel permeation chromatograph equipped with refractive index detection.

GC: GC analysis was performed on a Hewlett Packard Model 5890 series II gas chromatograph equipped with a DB-1 column.

FTIR: FTIR was recorded on a Mattson Genesis Series FTIR.

DSC: A Perkin Elmer 7700 DSC was used to determine the $T_g$ (glass transition temperature) of the co- and terpolymers of this invention. The heating rate was maintained at 10° C./minute, generally, over a temperature range of 50° C. to 400° C. The flow rate of nitrogen or air is maintained at 20 mL/min.

UV-Vis of samples were taken using a Hewlett Packard Vectra 486/33VL UV-Vis spectrophotometer.

Example 1

A four-neck 500 mL glass round-bottom flask fitted with a chilled water reflux condenser, a thermowell with thermocouple, a nitrogen inlet and outlet, an overhead stirrer, and an external heating mantle was charged with a reaction mixture of 73.1 grams (0.44 moles) of ASM, 15.9 grams (0.15 moles) of styrene, and 13.4 grams (0.10 moles) of t-butyl acrylate with stirring. To this mixture was then added 117 grams of methanol and the entire reaction mixture was heated to 66° C. over a period of one hour. At this time the polymerization was initiated by adding 11 grams (75% concentration; 7 mole percent based upon total number of moles of monomers) of t-BPP diluted in 11 grams of methanol. After one hour of polymerization, 0.66 grams of t-BPP diluted in 1 gram of methanol was added. At each hour, for the next 3 hours, 0.66 grams of t-BPP in 1 gram of methanol was added. After each addition, a sample of the polymer mixture was withdrawn from the reactor and analyzed for the unreacted monomers by capillary gas chromatography (GC). The polymerization reaction was continued for about a total period of 18 hours. At the end of this period, analysis of the final polymer mixture sample by capillary GC showed greater than 98% by weight conversion of the monomers to polymer. The transesterification reaction of p-acetoxy groups to p-hydroxy groups was begun without cooling the reaction mixture; 0.9 grams of sodium methoxide dissolved in 4 grams of methanol was added to the reaction mixture (of this 0.4 grams of sodium methoxide was used to neutralize the acetic acid present in the ASM monomer and 0.5 grams to carry out the transesterification thus amounting to 2 mole percent of catalyst level). The reaction mixture was continued to reflux with concomitant removal of methanol/methyl acetate as distillate and fresh methanol was added to compensate for the distillate. The reaction mixture was allowed to react until the solution turned clear in about 4 hours at which time the reaction mixture was cooled, precipitated in deionized water, and the precipitated polymer was isolated by filtration. A $^{13}C$ NMR analysis of the product indicated 86% conversion of the acetoxy groups to hydroxy groups. A $^1H$ NMR analysis indicated that the t-butyl groups in the acrylate repeat units were intact and were not cleaved during the transesterification reaction.

Example 2

Example 1 was repeated in this Example 2 except that the transesterification reaction with sodium methoxide at 2 mole percent level was carried out for a period of about 18 hours under reflux. The by-product methyl acetate was continuously removed and a requisite amount of fresh methanol was added to compensate for methanol/methyl acetate distilled as in Example 1. Analysis of the final polymer product by $^{13}$C NMR indicated quantitative conversion of p-acetoxy groups to p-hydroxy groups and t-butyl groups of the acrylate repeat units were not cleaved as confirmed by $^1$H NMR analysis.

Example 3

Example 1 was repeated in this Example 3 with the exception that the amount of sodium methoxide used in the transesterification step was 0.43 grams as 25 weight percent solution in methanol. Of this amount 0.38 grams of sodium methoxide was used to neutralize acetic acid present in the ASM monomer. The remainder, 0.05 grams of sodium methoxide was used as the catalyst for transesterification, which amounted to 0.2 mole percent catalyst level. The transesterification reaction was carried out for a period of about of 52 hours under reflux. The solution was cloudy and the polymer precipitated when fresh methanol was added indicating that the transesterification reaction was very slow at this catalyst level.

Example 4

Example 1 was repeated in this Example 4 with the exception that 1.4 grams of sodium methoxide was employed in the transesterification step, which amounted to four mole percent catalyst level after accounting for 0.38 grams of sodium methoxide needed to neutralize the acetic acid present in ASM. In addition, 15 grams of THF was charged into the reaction mixture in the transesterification step in order to improve the solubility of the polymer in methanol. After five and a half hours of refluxing in methanol, the polymer solution was completely clear at which time the reaction mixture was cooled. A portion of the polymer solution was precipitated in water and analyzed by NMR, which indicated quantitative conversion of p-acetoxy groups to p-hydroxy groups and the t-butyl groups were not cleaved. The remainder portion of the polymer solution was passed through an Amberlyst 15 ion exchange bed (2 inch diameter×6 inch long), precipitated in deionized water, filtered and washed with deionized water. The white polymeric product was dried under vacuum at 65° C. The GPC analysis of the polymer showed weight-average molecular weight to be 9,700 and polydispersity of 2.1. The monomer composition of the polymer as determined by NMR was as follows: 64 mole % p-hydroxystyrene; 22 mole percent styrene; and 14 mole percent t-butyl acrylate.

Example 5

Example 1 was repeated in Example 5 except that the reaction was carried out in a 5 liter round-bottom flask reactor employing following amounts of materials:

| | |
|---|---|
| ASM | 819.2 grams (96.8% purity; 4.9 moles) |
| Styrene | 177.9 grams (1.7 moles) |
| t-Butyl Acrylate | 150.1 grams (1.2 moles) |
| Methanol | 1342 grams |
| t-BPP | 116.2 grams (75.6%; 6.5 mole % based upon total number of moles of monomers) |

After the polymerization was initiated, four additional batches of 7.4 grams of t-BPP was added to the reactor at the end of each hour and the polymerization reaction was continued for an additional period of about 18 hours. At the end of this period, 20 grams of sodium methoxide dissolved in 84 grams of methanol was added to the reactor. Of this amount, 4.2 grams of sodium methoxide was needed to neutralize the acetic acid and 15.8 grams (six mole % catalyst level) of sodium methoxide was used for transesterification. In the first hour, 162 grams of methanol/methyl acetate was distilled and 160 grams of fresh methanol and 150 grams THF were added to the reactor. In the next six hours, about 180 grams of methanol/methyl acetate was collected as distillate and the reactor was replaced with 180 grams of fresh methanol. Samples were taken every hour to determine the extent of transesterification reaction by NMR. At the end of six hours, the NMR analysis showed quantitative conversion of acetoxy groups to hydroxy groups at which time the reaction was stopped, and the reaction mixture was cooled to ambient temperature. The cooled polymer solution was pumped through an Amberlyst 15 ion exchange bed at a rate of 200 mL/minute. The ion exchange bed was then washed using an additional 2800 grams of fresh methanol to remove any adsorbed polymer on the bed. The polymer solution and the washings were then added dropwise into deionized water to precipitate the terpolymer. The polymer was filtered and dried under vacuum at 65° C. The GPC analysis of the polymer showed a weight-average molecular weight of 10,400 and polydispersity of 2. The polymer composition as determined by NMR analysis is as follows: 63 mole % 15 p-hydroxystyrene; 22 mole percent styrene; and 15 mole percent t-butyl acrylate.

Example 6

Example 1 was repeated in Example 6 except that the reaction was carried out in a 5 liter round-bottom flask reactor employing following amounts of materials:

| | |
|---|---|
| ASM | 811.9 grams (96.8% purity; 4.8 moles) |
| Styrene | 176.3 grams (1.7 moles) |
| Tert.-Butyl Acrylate | 148.8 grams (1.2 moles) |
| Methanol | 1330 grams |
| t-BPP | 115.2 grams (75.6%; 6.5 mole % based upon total number of moles of monomers) |

After the polymerization was initiated, four additional batches of 7.4 grams of t-BPP was added to the reactor at the end of each hour and the polymerization reaction was continued for an additional period of about 18 hours. At the end of this period, 20 grams of sodium methoxide dissolved in 84 grams of methanol was added to the reactor. Of this amount, 4.2 grams of sodium methoxide was needed to neutralize the acetic acid and 15.8 grams (six mole % catalyst level) of sodium methoxide was used for transesterification. The transesterification reaction was carried out for a total period of 4½ hours during which time about 900 grams of methanol/methyl acetate was collected as distillate and the reactor was replaced with 900 grams of fresh methanol. Samples were taken every hour to determine the extent of transesterification reaction by NMR. At the end of 4½ hours, the NMR analysis showed quantitative conversion of acetoxy groups to hydroxy groups at which time the reaction was stopped, and the reaction mixture was cooled to ambient temperature. The cooled polymer solution was pumped through an Amberlyst 15 ion exchange bed at a rate of 200 mL/minute. The ion exchange bed was then washed using an additional 2800 grams of fresh methanol to remove any adsorbed polymer on the bed. The polymer solution and the washings were then added dropwise into deionized water to precipitate the terpolymer. The polymer was filtered and dried under vacuum at 65° C. The GPC analysis of the polymer showed a weight-average molecular weight of 10,400 and polydispersity of 2. The polymer was also analyzed for trace metals: aluminum, 180 parts per billion (ppb); calcium, 63 ppb; iron 120 ppb; sodium, 270 ppb; and zinc, 21 ppb. The polymer composition as determined by NMR analysis was as follows: 62 mole percent p-hydroxystyrene; 24 mole percent styrene; and 15 mole percent t-butyl acrylate.

Example 7

Example 1 was repeated in Example 7 except that the reaction was carried out in a 5 liter round-bottom flask reactor employing following amounts of materials:

| | |
|---|---|
| ASM | 700 grams (96.8% purity; 4.2 moles) |
| t-Butyl Acrylate | 334.6 grams (98% purity; 2.6 moles) |
| Methanol | 1200 grams |
| t-BPP | 72.9 grams (75.6%; 4.7 mole % based upon total number of moles of monomers) |

After the polymerization was initiated, four additional batches of 6.7 grams of t-BPP was added to the reactor at the end of each hour and the polymerization reaction was continued for an additional period of about 18 hours. At the end of this period, 16 grams of sodium methoxide dissolved in 64 grams of methanol was added to the reactor. Of this amount, 2.7 grams of sodium methoxide was needed to neutralize the acetic acid and 13.3 grams (six mole % catalyst level) of sodium methoxide was used for transesterification. The transesterification reaction was carried out for a total period of 4 hours by adding initially about 970 grams of methanol to the reaction mixture. An additional quantity of fresh methanol was added to the reaction mixture as methanol/methyl acetate was collected as distillate. Samples were taken every hour to determine the extent of transesterification reaction by NMR. At the end of 4 hours, the NMR analysis showed quantitative conversion of acetoxy groups to hydroxy groups at which time the reaction was stopped, and the reaction mixture was cooled to ambient temperature. The cooled polymer solution was pumped through an Amberlyst 15 ion exchange bed at a rate of 150 mL/minute. 300 mL of cooled polymer solution was added dropwise into 3000 mL of deionized water to precipitate the polymer. The polymer was filtered and dried under vacuum at 65° C.; final dried product 700 grams. The GPC analysis of the polymer showed a weight-average molecular weight of 19,800 and polydispersity of 2.1. The polymer composition as determined by NMR analysis is as follows: 62 mole percent p-hydroxystyrene; and 38 mole percent t-butyl acrylate. A UV-VIS scan showed a molar absorptivity of 82 L cm$^{-1}$ mole$^{-1}$ at 248 nm. The polymer exhibited a $T_g$ of 138.6° C. as measured by DSC.

Example 8

Example 1 was repeated in Example 8 except that the reaction was carried out in a 5 liter round-bottom flask reactor employing following amounts of materials:

| | |
|---|---|
| ASM | 700 grams (96.8% purity; 4.2 moles) |
| t-Butyl Acrylate | 334.6 grams (98% purity; 2.6 moles) |
| Methanol | 1200 grams |
| t-BPP | 72.9 grams (75.6%; 4.7 mole % based upon total number of moles of monomers) |

After the polymerization was initiated, four additional batches of 6.7 grams of t-BPP was added to the reactor at the end of each hour and the polymerization reaction was continued for an additional period of about 18 hours. At the end of this period, 16 grams of sodium methoxide dissolved in 64 grams of methanol was added to the reactor. Of this amount, 2.7 grams of sodium methoxide was needed to neutralize the acetic acid and 13.3 grams (six mole % catalyst level) of sodium methoxide was used for transesterification. The transesterification reaction was carried out for a total period of 4½ hours by adding initially about 960 grams of methanol to the reaction mixture. Additional quantities of fresh methanol were added to the reaction mixture as methanol/methyl acetate was collected as distillate. Samples were taken every hour to determine the extent of transesterification reaction by NMR. At the end of 4½ hours, the NMR analysis showed quantitative conversion of acetoxy groups to hydroxy groups at which time the reaction was stopped, and the reaction mixture was cooled to ambient temperature. The cooled polymer solution was pumped through two Amberlyst 15 ion exchange beds at a rate of 130 mL/minute. 300 mL of cooled polymer solution was added dropwise into 3000 mL of deionized water to precipitate the polymer. The precipitated polymer was filtered and dried under vacuum at 65° C. The GPC analysis of the polymer showed a weight-average molecular weight of 19,000 and polydispersity of 2. The polymer composition as determined by NMR analysis is as follows: 61 mole percent p-hydroxystyrene; and 39 mole percent t-butyl acrylate. A UV-VIS scan showed a molar absorptivity of 84 L cm$^{-1}$ mole$^{-1}$ at 248 nm. The polymer exhibited a $T_g$ of 139.9° C. as measured by DSC. Trace metal analysis showed the presence of following metals at the indicated levels: aluminum 69 ppb; calcium 57 ppb; iron 140 ppb; sodium 140 ppb; zinc 24 ppb.

Example 9

Example 1 was repeated in Example 9 except that the reaction was carried out in a 5 liter round-bottom flask reactor employing following amounts of materials:

| | |
|---|---|
| ASM | 700 grams (96.8% purity; 4.2 moles) |
| t-Butyl Acrylate | 294 grams (98% purity; 2.25 moles) |
| Methanol | 1150 grams |
| t-BPP | 65.1 grams (75.6%; 4.7 mole % based upon total number of moles of monomers) |

After the polymerization was initiated, four additional batches of 6.4 grams of t-BPP was added to the reactor at the end of each hour and the polymerization reaction was continued for an additional period of about 18 hours. At the end of this period, 11.6 grams of sodium methoxide dissolved in 46 grams of methanol was added to the reactor. Of this amount, 2.6 grams of sodium methoxide was needed to neutralize the acetic acid and 9 grams (4 mole % catalyst level) of sodium methoxide was used for transesterification. The transesterification reaction was carried out for a total period of 8½ hours by adding initially about 380 grams of methanol to the reaction mixture. Additional quantities of fresh methanol were added to the reaction mixture as methanol/methyl acetate was collected as distillate. Samples were taken every hour to determine the extent of transesterification reaction by NMR. At the end of 8½ hours, the NMR analysis showed quantitative conversion of acetoxy groups to hydroxy groups at which time the reaction was stopped, and the reaction mixture was cooled to ambient temperature. The cooled polymer solution was pumped through an Amberlyst 15 ion exchange bed at a rate of 130 mL/minute. The cooled polymer solution was added dropwise into 3000 mL of deionized water to precipitate the polymer. The precipitated polymer was filtered and dried under vacuum at 65° C.; yield 630 grams. The GPC analysis of the polymer showed a weight-average molecular weight of 18,000 and polydispersity of 2.3. The polymer composition as determined by NMR analysis is as follows: 66 mole percent p-hydroxystyrene; and 34 mole percent t-butyl acrylate. A UV-VIS scan showed a molar absorptivity of 86 L cm$^{-1}$ mole$^{-1}$ at 248 nm. The polymer exhibited a $T_g$ of 149.1° C. as measured by DSC.

Example 10

Example 1 was repeated with the exception that sodium hydroxide was used as the catalyst. 0.07 grams of sodium hydroxide were used to neutralize the acetic acid present in ASM. 0.1 grams of sodium hydroxide were used as transesterification catalyst, which amounted to a catalyst level of 0.5 mole %. The transesterification reaction was carried out for a period of 4 hours under reflux in methanol while distilling-off methyl acetate/methanol and fresh methanol added to the reaction mixture as needed. At the end of this period, NMR analysis of the product indicated 70 percent of the acetoxy groups to hydroxy groups.

Example 11

Comparative Example

This Example demonstrates that large excess of triethylamine is needed to change acetoxy groups to hydroxy groups. Example 1 was substantially repeated in Example 11 with the exception that triethylamine was used as the catalyst instead of sodium methoxide. 0.18 grams of triethylamine were used to neutralize the acetic acid in ASM and 0.48 grams of triethylamine was used for the transesterification reaction, which amounted to a catalyst level of 1 mole %. The reaction mixture was refluxed for 7 hours while removing continuously methanol/methyl acetate as distillate. The reaction was very slow and the polymer solution did not become clear during this time. Addition of fresh methanol resulted in precipitation of the unhydrolyzed polymer. At this time 27.9 grams of triethylamine (60 mole % catalyst level) was added to the reaction mixture and the reaction mixture was allowed to reflux for overnight (18 hours). Analysis of sample by NMR after this time indicated quantitative conversion of acetoxy groups to hydroxy groups. The reaction mixture was cooled and added dropwise to 3500 mL deionized water to precipitate the polymer. To completely remove triethylamine and the by-product, the filtered polymer was again taken in a 4 L beaker and filled with deionized water and heated to 50° C. with stirring for 1 hour. The hot slurry was filtered, washed thoroughly with deionized water, and dried under vacuum at 65° C. The NMR analysis of the dried polymer showed no acetoxy groups.

Example 12

Comparative Example

This Example demonstrate that 4-dimethylaminopyridine (4-DMAP) is not effective a catalyst for transesterification. Example 1 was substantially repeated in Example 12 with the exception that 4-DMAP was used as the catalyst instead of sodium methoxide. 0.09 grams (0.15 mole %) of 4-DMAP in three equal portions was charged into the reaction mixture as the transesterification catalyst over a period of 5 hours and the reaction was continued for 18 hours during which time no appreciable amounts of transesterification took place as evidenced by the insolubility of the polymer in methanol. 0.6 grams (1 mole %) of additional 4-DMAP in five portions was added to the reaction mixture over a period of 7½ hours and the reaction mixture was continued to reflux during this period. The reaction was still very slow and the polymer solution did not become clear during this time. Analysis of sample by NMR after this time indicated only 69 percent conversion of acetoxy groups to hydroxy groups.

Example 13

A four-neck 5 L glass round-bottom flask fitted with a chilled water reflux condenser, a themowell with thermocouple, a nitrogen inlet and outlet, an overhead stirrer, and an external heating mantle was charged with a reaction mixture of 333.5 grams (2.06 moles) of ASM and 680.3 grams (3.27 moles) of isobornyl acrylate with stirring. To this mixture was then added 1087.6 grams of methanol and 120.8 grams of tetrahydrofuran. The entire reaction mixture was heated to 66° C. over a period of one hour and at this time the polymerization was initiated by adding 33.8 grams (75% concentration; 2.9 mole percent based upon total number of moles of monomers) of t-BPP diluted in 35.0 grams of methanol. After one hour of polymerization, 6.65 grams of t-BPP diluted in 6.65 grams of methanol was added. At each hour, for the next 3 hours, 6.65 grams of t-BPP in 6.65 grams of methanol was added. After each addition, a sample of the polymer mixture was withdrawn from the reactor and analyzed for the unreacted monomers by capillary gas chromatography (GC). The polymerization reaction was continued for about a total period of 18 hours. At the end of this period, analysis of the final polymer mixture by capillary GC showed greater than 98% by weight conversion of the monomers to polymer. The transesterification reaction of p-acetoxy groups to p-hydroxy groups was begun without cooling the reaction mixture; 10.4 grams of 25 wt % sodium methoxide in methanol solution dissolved in 100.0 grams of methanol was added to the reaction mixture. The reaction mixture was continued to reflux with concomitant removal of methanol/methyl acetate as distillate and fresh methanol was added to compensate for the distillate. The reaction mixture was allowed to react until the solution turned clear in about 4 hours at which time the reaction mixture was cooled. The catalyst was removed by passing the cold solution through a column containing an acid ion exchange resin. The solid was isolated by precipitation in deionized water (10:1 water:solution ratio), and the precipitated polymer was isolated by filtration. A total of 900.0 grams of solid was isolated as Poly(4-hydroxystyrene) (isobornylacrylate).

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A process for the preparation of a copolymer of IV,

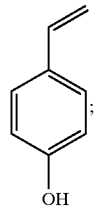

IV an alkyl acrylate monomer having the formula II,

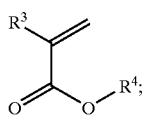

II and optionally an ethylenically unsaturated copolymerizable monomer selected from the group consisting of styrene, 4-methyistyrene, styrene alkoxide wherein the alkyl portion is $C_1-C_5$ straight or branch chain, maleic anhydride, dialkyl maleate, dialkyl fumarate and vinyl chloride, wherein alkyl is having 1 to 4 carbon atoms, comprising the steps of:

a) subjecting a monomer of formula V,

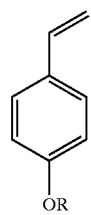

V wherein R is either —OC(O) $R^5$ or —$OR^5$ along with said acrylate monomer II, and optionally said copolymerizable monomer to suitable polymerization conditions in an alcohol solvent and in the presence of a free radical initiator at suitable temperature for a sufficient period of time to produce a polymer of corresponding composition;

b) subjecting said polymer from step a) to transesterification conditions in said alcohol solvent in the presence of catalytic amounts of an alkyl metal alkoxide or hydroxide catalyst at reflux temperature of said alcohol solvent such that the transesterified by-product acetate formed is continuously removed from the reaction mixture to form the polymer of IV, II, and said copolymerizable monomer; and c) passing said polymer solution in said alcohol solvent from step b) through an ion- exchange bed to remove said catalyst;

wherein:

$R^3$ is selected from the group consisting of:
hydrogen, methyl, ethyl, n-propyl, iso-propyl, n-butyl, iso-butyl or tert.-butyl; and $R^4$ is selected from the group consisting of:
methyl, ethyl, n-propyl, iso-propyl, n-butyl, iso-butyl, tert.-butyl, tert.-amyl, benzyl, cyclohexyl, 9-anthracenyl, 2-hydroxyethyl, cinnamyl, adamantyl, isobornyl, 2-ethoxyethyl, n-heptyl, n-hexyl, 2-hydroxypropyl, 2-ethylbutyl, 2-metboxypropyl, 2-(2-methoxyethoxyl), 2-naphthyl, 2-phenylethyl, or phenyl;

$R^5$ is $C_1-C_5$ alky, either straight or branch chain with the proviso that in steps (a), (b) and (c), said three steps are all carried out under anhydrous conditions.

2. The process as set forth in claim 1 wherein $R^3$ is hydrogen.

3. The process as set forth in claim 1 wherein $R^3$ is methyl.

4. The process as set forth in claim 1 wherein said initiator is selected from the group consisting of 2,2'-azobis(2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, dimethyl 2,2'-azobisisobutyrate and combinations thereof.

5. The process as set forth in claim 1 wherein said alcohol solvent is an alcohol having 1 to 4 carbon atoms selected from the group consisting of methanol, ethanol, isopropanol, tert.-butanol, and combinations thereof.

6. The process as set forth in claim 1 wherein said alcohol solvent is methanol and $R^5$ is methyl.

7. The process as set forth in claim 1 wherein said catalyst will not substantially react with said alkyl acrylate monomer II or with said copolymerizable monomers.

8. The process as set forth in claim 1 wherein said catalyst is alkali metal alkoxide or hydroxide.

9. The process as set forth in claim 1 wherein said catalyst is selected from the group consisting of lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, NaOH, KOH, LiOH, CeOH, and combinations thereof.

10. The process as set forth in claim 7 wherein said catalyst is sodium methoxide and is present in an amount of about 0.1 mole percent to about 2 mole percent based upon the atomic weight of sodium and moles of monomer IV present in said polymer.

11. The process as set forth in claim 1 wherein said catalyst is added in step b) by dissolving it in said alcohol solvent.

12. The process as set forth in claim 1 wherein said catalyst is sodium hydroxide.

13. The process as set forth in claim 1 wherein there is an additional step (d) wherein said polymer is isolated from step (c) by precipitation from said alcohol solvent.

14. The process as set forth in claim 13 wherein said precipitation of said polymer is accomplished by adding said reaction medium to a non-alcohol solvent.

15. The process as set forth in claim 14 wherein said non-alcohol solvent for the product selected from the group consisting of water, heptane, hexane, octane, petroleum ether, and combinations thereof.

16. The process as set forth in claim 15 wherein said non-alcohol solvent is water.

17. A process for the preparation of a copolymer of IV,

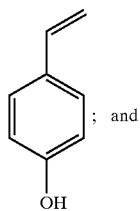

an alkyl acrylate monomer having the formula II,

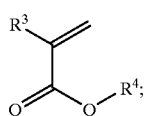

comprising the steps of;
a) subjecting a monomer of formula V,

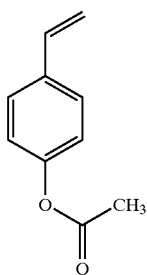

along with said monomer II, to suitable polymerization conditions in a carboxylic alcohol solvent and in the presence of a free radical initiator at suitable temperature for a sufficient period of time to produce a polymer of corresponding composition;
b) subjecting said polymer from step (a) to transesterification conditions in said alcohol solvent in the presence of catalytic amounts of an alkali metal alkoxide or hydroxide catalyst at reflux temperature of said alcohol solvent such that the transesterified by-product acetate formed is continuously removed from the reaction mixture to form the polymer of IV and II, and
c) passing said polymer solution in said alcohol solvent from step (b) through an ion-exchange bed to remove said catalyst; and
wherein:
$R^3$ is selected from the group consisting of: hydrogen, methyl, ethyl, n-propyl, iso-propyl, n-butyl, iso-butyl or tert.-butyl; and
$R^4$ is selected from the group consisting of: methyl, ethyl, n-propyl, iso-propyl, n-butyl, iso-butyl, tert.-butyl, tert.-amyl, benzyl, cyclohexyl, 9-anthracenyl, 2-hydroxyethyl, cinnamyl, adamantyl, isobornyl, 2-ethoxyethyl, n-heptyl, n-hexyl, 2-hydroxypropyl, 2-ethylbutyl, 2-methoxypropyl, 2-(2-methoxyethoxyl), 2-naphthyl, 2-phenylethyl, or phenyl;
with the proviso that in steps (a), (b) and (c), said three steps are all carried out under anhydrous conditions.

18. The process as set forth in claim 17 wherein $R^3$ is hydrogen.

19. The process as set forth in claim 17 wherein $R^3$ is methyl.

20. The process as set forth in claim 17 wherein said initiator is selected from the group consisting of 2,2'-azobis(2,4-dimethylpentanenitrile), 2,2'-azobis(2-methylpropanenitrile), 2,2'-azobis(2-methylbutanenitrile), 1,1'-azobis(cyclohexanecarbonitrile), t-butyl peroxy-2-ethylhexanoate, t-butyl peroxypivalate, t-amyl peroxypivalate, dimethyl 2,2'-azobisisobutyrate and combinations thereof.

21. The process as set forth in claim 17 wherein said alcohol solvent is an alcohol having 1 to 4 carbon atoms selected from the group consisting of methanol, ethanol, isopropanol, tert.-butanol, and combinations thereof.

22. The process as set forth in claim 17 wherein said alcohol solvent is methanol.

23. The process as set forth in claim 17 wherein said catalyst will not substantially react with said alkyl acrylate monomer II.

24. The process as set forth in claim 17 wherein said catalyst is alkali metal alkoxide or hydroxide.

25. The process as set forth in claim 17 wherein said catalyst is selected from the group consisting of lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, NaOH, KOH, LiOH, CeOH, and combinations thereof.

26. The process as set forth in claim 23 wherein said catalyst is sodium methoxide and is present in an amount of about 0.1 mole percent to about 2 mole percent based upon the atomic weight of sodium and moles of monomer IV present in said polymer.

27. The process as set forth in claim 23 wherein said catalyst is added in step b) by dissolving it in said alcohol solvent.

28. The process as set forth in claim 27 wherein said catalyst is sodium hydroxide.

29. The process as set forth in claim 1 wherein there is an additional step after step c, and wherein the alcoholic solvent is removed and replaced by a photoresist compatible solvent.

* * * * *